United States Patent

Nango et al.

(10) Patent No.: US 9,601,197 B2
(45) Date of Patent: Mar. 21, 2017

(54) MEMORY SYSTEM AND CONTROL METHOD

(71) Applicant: Kabushiki Kaisha Toshiba, Minato-ku (JP)

(72) Inventors: Takahiro Nango, Inagi (JP); Shingo Akita, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 269 days.

(21) Appl. No.: 14/481,437

(22) Filed: Sep. 9, 2014

(65) Prior Publication Data

US 2015/0255149 A1    Sep. 10, 2015

Related U.S. Application Data

(60) Provisional application No. 61/950,573, filed on Mar. 10, 2014.

(51) Int. Cl.

| | |
|---|---|
| *G11C 14/00* | (2006.01) |
| *G11C 7/20* | (2006.01) |
| *G11C 5/14* | (2006.01) |
| *G11C 11/417* | (2006.01) |

(52) U.S. Cl.

CPC .......... *G11C 14/0063* (2013.01); *G11C 5/148* (2013.01); *G11C 7/20* (2013.01); *G11C 11/417* (2013.01)

(58) Field of Classification Search

None
See application file for complete search history.

(56) References Cited

U.S. PATENT DOCUMENTS

| | | | |
|---|---|---|---|
| 7,616,519 B2 | 11/2009 | Komatsu et al. | |
| 2002/0040416 A1* | 4/2002 | Tsern | G06F 1/3203 |
| | | | 711/105 |

(Continued)

FOREIGN PATENT DOCUMENTS

| | | |
|---|---|---|
| JP | 2008-4218 | 1/2008 |
| JP | 2011-8430 | 1/2011 |

(Continued)

*Primary Examiner* — Denise Tran
(74) *Attorney, Agent, or Firm* — Oblon, McClelland, Maier & Neustadt, L.L.P.

(57) ABSTRACT

According to one embodiment, there is provided a memory system including a volatile memory and a controller. The volatile memory has $1^{st}$ to $K^{th}$ memory banks (K is a natural number equal to or larger than 2) that are kept in a power-on state and $(K+1)^{th}$ to $N^{th}$ memory banks (N is a natural number larger than K) whose power state is changed. The power state is the power-on state or a power-down state. The controller performs wake-up operation for the $(K+1)^{th}$ to $N^{th}$ memory banks in parallel with access operation to the $1^{st}$ to $K^{th}$ memory banks. The wake-up operation changes the power state from the power-down state to the power-on state.

20 Claims, 9 Drawing Sheets

(56) References Cited

U.S. PATENT DOCUMENTS

| | | | | |
|---|---|---|---|---|
| 2005/0210206 A1* | 9/2005 | Woodbridge | ....... | G06F 12/0215 711/154 |
| 2008/0043562 A1* | 2/2008 | Totolos | .................... | G11C 5/04 365/227 |
| 2010/0313052 A1 | 12/2010 | Ueda | | |
| 2011/0058217 A1 | 3/2011 | Saito | | |

FOREIGN PATENT DOCUMENTS

| | | |
|---|---|---|
| JP | 2011-59937 | 3/2011 |
| JP | 2013-3682 | 1/2013 |

* cited by examiner

MEMORY SYSTEM AND CONTROL METHOD

CROSS-REFERENCE TO RELATED APPLICATIONS

This application is based upon and claims the benefit of priority from Provisional Application No. 61/950,573, filed on Mar. 10, 2014; the entire contents of which are incorporated herein by reference.

FIELD

Embodiments described herein relate generally to a memory system and control method

BACKGROUND

SRAMs are lower in power consumption and faster in operation speed than DRAMs because refresh operation is not required, and hence may be used as a cache memory in a memory system. However, in order to hold data stored in an SRAM, power needs to continue to be supplied to the SRAM, which is a cause of increasing power consumption. Accordingly, it is desired to reduce power consumption in SRAMs.

DETAILED DESCRIPTION

In general, according to one embodiment, there is provided a memory system including a volatile memory and a controller. The volatile memory has $1^{st}$ to $K^{th}$ memory banks (K is a natural number equal to or larger than 2) that are kept in a power-on state and $(K+1)^{th}$ to $N^{th}$ memory banks (N is a natural number larger than K) whose power state is changed. The power state is the power-on state or a power-down state. The controller performs wake-up operation for the $(K+1)^{th}$ to $N^{th}$ memory banks in parallel with access operation to the $1^{st}$ to $K^{th}$ memory banks. The wake-up operation changes the power state from the power-down state to the power-on state.

Exemplary embodiments of a memory system will be explained below in detail with reference to the accompanying drawings. The present invention is not limited to the following embodiments.

(Embodiment)

Figure 1:
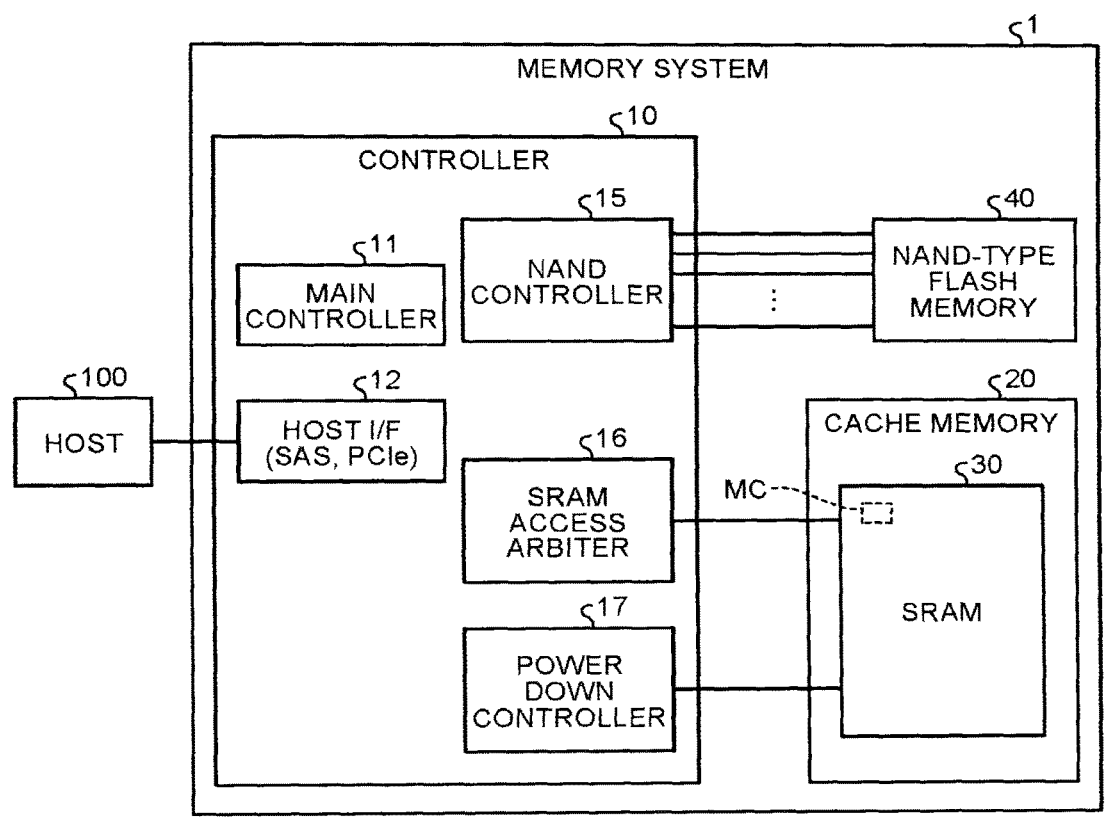
FIG. 1 is a diagram showing the configuration of a memory system according to an embodiment.

A memory system 1 according to the embodiment will be described using FIG. 1. FIG. 1 is a diagram showing the configuration of the memory system 1.

The memory system 1 is connected externally to a host 100 via a communication medium and functions as an external storage medium for the host 100. The host 100 includes, for example, a personal computer or a CPU core. The memory system 1 includes, for example, SSD (Solid State Drive).

The memory system 1 has a controller 10, a NAND-type flash memory 40, and a cache memory 20. The controller 10, in response to a request from the host 100, accesses the NAND-type flash memory 40 to write or read data into or from the NAND-type flash memory 40. At this time, the controller 10 has the cache memory 20 temporarily hold data to be written into the NAND-type flash memory 40 that has been received from the host 100 and has the cache memory 20 temporarily hold data to be transmitted to the host 100 that has been read from the NAND-type flash memory 40. The cache memory 20 has an SRAM (Static Random Access Memory) 30.

The controller 10 has a main controller 11, a host I/F 12, a NAND controller 15, an SRAM access arbiter 16, and a power down controller 17.

When receiving a command and data from the host 100, the host I/F 12 transfers the command and data to the main controller 11 while having the cache memory 20 temporarily hold the data. When a response notification and data is transferred from the main controller 11, the host I/F 12 transmits the response notification and data to the host 100 while having the cache memory 20 temporarily hold the data. The host I/F 12 is an interface compliant with, e.g., SAS (Serial Attached SCSI) or PCIe (Peripheral Component Interconnect Express) Standard.

The main controller 11 controls comprehensively the parts of the controller 10. For example, when the host I/F 12 receives a write command and data from the host 100, the main controller 11 receives the write command and data from the host I/F 12 and creates a write request according to the write command to supply to the NAND controller 15. The main controller 11 supplies the write data to the NAND controller 15 while having the cache memory 20 temporarily hold the write data. When receiving a write completion notification from the NAND controller 15, the main controller 11 transfers the notification to the host I/F 12, and the host I/F 12 transmits the write completion notification to the host 100.

When the host I/F 12 receives a read command and data from the host 100, the main controller 11 receives the read command and data from the host I/F 12 and creates a read request according to the read command to supply to the NAND controller 15. When receiving a read completion notification and data from the NAND controller 15, the main controller 11 transfers the read completion notification to the host I/F 12. The main controller 11 transfers the read data to the host I/F 12 while having the cache memory 20 temporarily hold the read data. The host I/F 12 transmits the read completion notification and data to the host 100.

When receiving the write request and data from the main controller 11, the NAND controller 15, referring to data held in the cache memory 20, writes the data into the NAND-type flash memory 40 according to the write request. When write operation finishes, the NAND controller 15 returns the write completion notification to the main controller 11. Further, when receiving the read request and data from the main controller 11, the NAND controller 15 reads data from the NAND-type flash memory 40 according to the read request and has the cache memory 20 temporarily hold the read data. When read operation finishes, the NAND controller 15 returns the read completion notification and data to the main controller 11.

The SRAM access arbiter 16 arbitrates access to the SRAM 30 from the parts in the controller 10. That is, regarding the parts in the controller 10 as masters and the SRAM 30 as a slave, the SRAM access arbiter 16 arbitrates access to the SRAM 30 (a slave) from the plurality of masters. The details of the SRAM access arbiter 16 will be described later.

The power down controller 17 controls operation relating to the power down state of the SRAM 30. The details of the power down controller 17 will be described later.

The NAND-type flash memory 40 has a memory cell array where multiple memory cells are arranged in a matrix, and each individual memory cell is capable of multivalued storage using an upper page and lower page. In the NAND-type flash memory 40, data erasure is performed on a block basis, and data writing and reading are performed on a page basis. The host 100 designates data to access (write/read) by LBA (Logical Block Addressing) in sector units. The sectors are decided on independently of units for data erasure/data writing/data reading of the NAND-type flash memory 40.

The cache memory 20 is an area to temporarily store write data from the host 100 in response to a write command from the host 100 and an area to temporarily store read data read out from the NAND-type flash memory 40 in response to a read command from the host 100. That is, high-speed access operation is required of the cache memory 20, and in order to satisfy this requirement, the cache memory 20 has the SRAM 30. The SRAM 30 has multiple memory cells MC, and each memory cell MC is, for example, a one-port-type SRAM memory cell.

Figure 2:
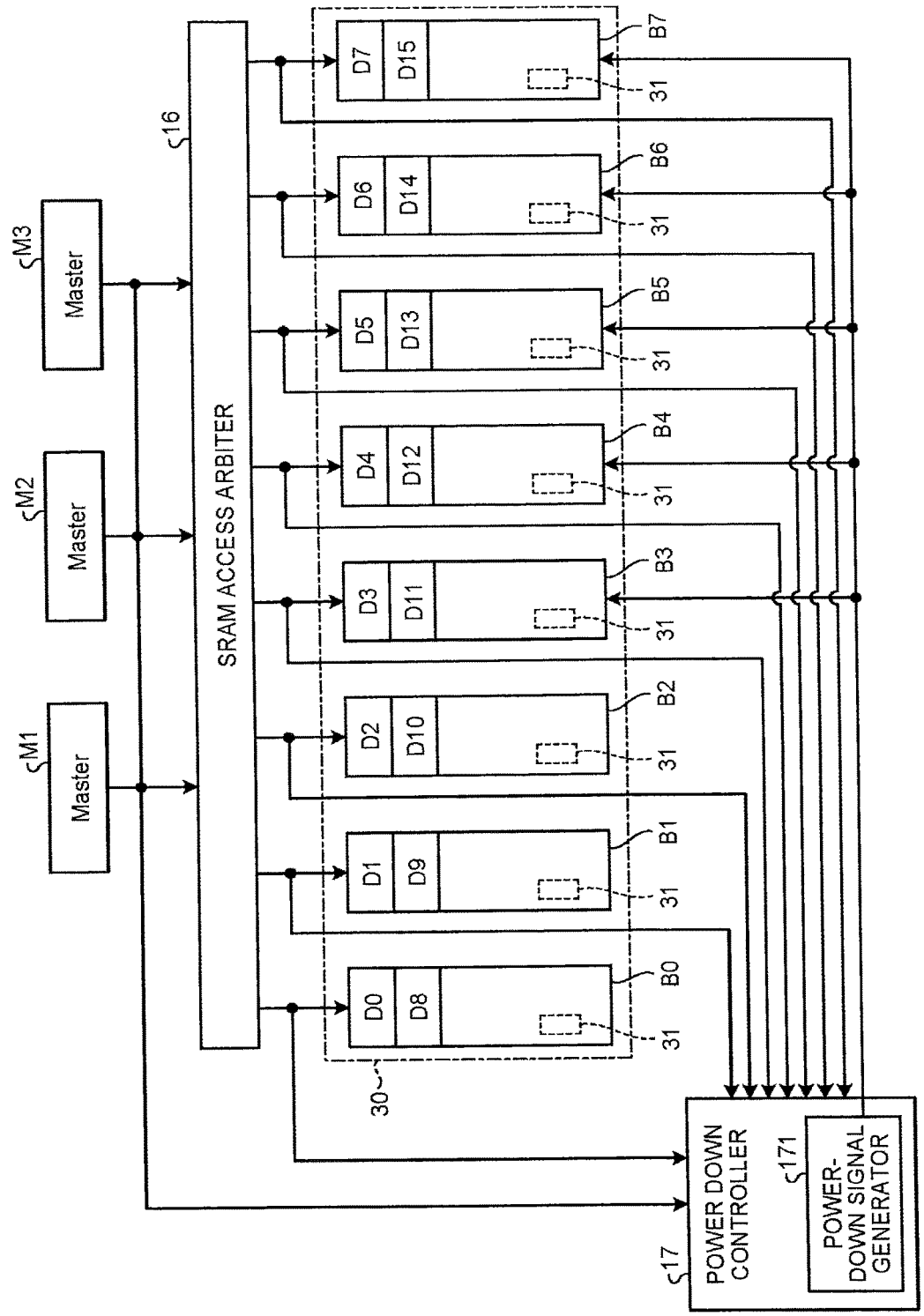
FIG. 2 is a diagram showing the configuration of an SRAM, an SRAM access arbiter, and a power down controller in the embodiment.

In the present embodiment, in the SRAM 30 including multiple memory banks, a power-on mode where the memory is put in a power-on state on a memory bank basis and a power-down mode where the memory is put in a power-down state on a memory bank basis are provided, and power-down control is performed which brings the memory banks between the power-on mode and the power-down mode. FIG. 2 shows the SRAM 30 including multiple memory banks B0 to B7. FIG. 2 illustrates the case where the number of memory banks B0 to B7 is eight, but the number of memory banks B0 to B7 is any number. In the SRAM 30, multiple memory cells MC are arranged two-dimensionally. Each memory bank B0 to B7 has multiple memory cells MC arranged along a column direction. The memory banks B0 to B7 are arranged along a line direction.

Figure 3:
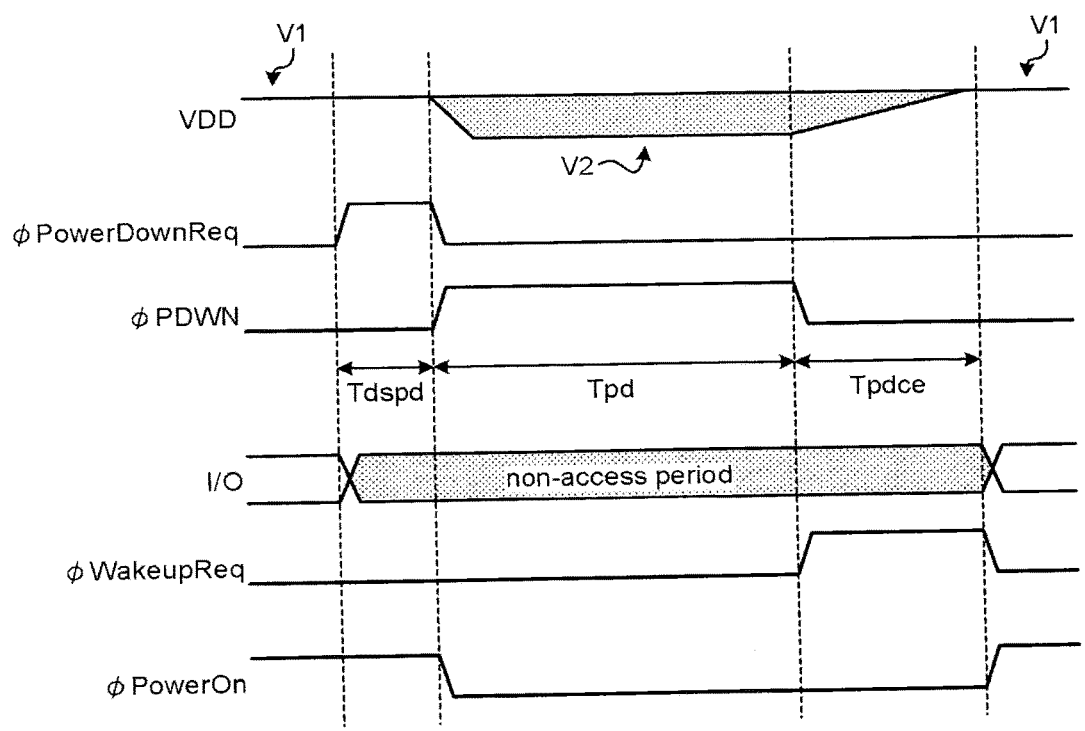
FIG. 3 is a diagram showing power-down control in the embodiment.

FIG. 3 is a diagram for explaining the power-down control of the memory banks. In FIG. 3, a power supply voltage VDD refers to a power supply voltage generated in the memory banks according to a power supply voltage received from the outside. A power-down request signal φPowerDownReq is a signal that is at an H level during the time when the power-down operation of a memory bank is being performed. The power-down operation is operation for securing a time period Tdspd from the time that access operation to the memory bank finishes to the time that it goes into a power-down state (the state where power supply voltage VDD is at a level V2).

A power-down signal φPDWN is a signal to be input to the power-down control port if the memory bank has a power-down control port. When at the H level, the memory bank is in the power-down state, and when at an L level, the memory bank is released from being in the power-down state.

A wake-up request signal φWakeupReq is a signal that is at the H level during the time when the wake-up operation of a memory bank is being performed. The wake-up operation is an operation for securing a time period Tpdce from the time that the memory bank is released from being in the power-down state to the time that access operation to the memory bank becomes possible.

When the power down controller 17 asserts the power-down signal φPDWN to be input to the power-down control port of a memory bank, the power supply voltage VDD of the SRAM 30 falls from the level V1 of the power-on state to the level V2 (<V1) of the power-down state, resulting in a reduction in power consumption of the memory bank. The power down controller 17 asserts the power-down signal φPDWN supplied to a memory bank, thereby putting the memory bank into the power-down state and deasserts the power-down signal φPDWN, thereby releasing the memory bank from being in the power-down state to be brought to the power-on state. At this time, in order to secure a timing margin in the operation of the memory bank, a time period of a certain length needs to be provided for the transition from the power-on state to the power-down state and the transition from the power-down state to the power-on state.

For example, during the time period Tdspd from the time that access operation to the memory bank finishes to the time that it goes into the power-down state, memory access is put in a non-selected state. This time period Tdspd is a non-access period for the memory before the power-down signal φPDWN is asserted. Subsequently, after the power-down period Tpd passes, when desiring to access again, the power down controller 17 deasserts the power-down signal φPDWN and simultaneously asserts the wake-up request signal φWakeupReq. Subsequent to this, the time period Tpdce until the time that memory access becomes actually possible is a non-access period for the memory after the power-down signal φPDWN is deasserted.

That is, the master (a part of the controller 10), which issues a request for access to the SRAM 30, cannot access the SRAM 30 for the time given by the following expression (1).

$$Tdspd+Tpd+Tpdce \qquad (1)$$

Accordingly, the power down controller 17 introduces the power-down request signal φPowerDownReq, which is at the H level during the time when the power-down operation is being performed to secure the time period Tdspd, as an intermediate signal to determine when to assert the power-down signal φPDWN with respect to the timing when access operation is presumed to have finished. Specifically, the power down controller 17 switches the power-down request signal φPowerDownReq from L to H at the timing when access operation is presumed to have finished based on an access request signal described later and switches the power-down request signal φPowerDownReq from H to L at the timing when the time period Tdspd passes from the switch from L to H.

The power down controller 17 introduces the wake-up request signal φWakeupReq, which is at the H level during the time when the wake-up operation is being performed to secure the time period Tpdce, as an intermediate signal to determine when to deassert the power-down signal φPDWN, back calculating with respect to the timing when it desires to start access operation. Specifically, the power down controller 17 switches the wake-up request signal φWakeupReq from L to H at the timing when it desires to deassert the power-down signal φPDWN, back calculating with respect to the timing when it desires to start access operation based on an access request signal described later and switches the wake-up request signal φWakeupReq from H to L at the timing when the time period Tpdce passes from the switch from L to H.

Further, the power down controller 17 introduces a power-on signal φPowerOn, which is at the H level during the time when the memory bank is in the power-on state (the state where power supply voltage VDD is at the level V1), as an intermediate signal to generate the power-down signal φPDWN. Specifically, the power down controller 17 switches the power-on signal φPowerOn from L to H at the timing when the time period Tpdce passes from the switch of the wake-up request signal φWakeupReq from L to H and switches the power-on signal φPowerOn from H to L at the timing when the time period Tdspd passes from the switch of the power-down request signal φPowerDownReq from L to H.

As shown in FIG. 3, the time period Tpdce for the transition from the power-down state to the power-on state denies the access to the memory bank for masters requesting access to the memory bank. Hence, in order to prevent access latency to the memory bank from becoming large, it is necessary to adjust the timing when to assert the wake-up request signal φWakeupReq of the memory bank so as to deassert the power-down signal φPDWN at an appropriate timing.

In the present embodiment, access operation to a first memory bank and the wake-up operation of a second memory bank (operation for securing the time period Tpdce from releasing the memory bank from being in the power-down state until access operation to the memory bank becomes possible) are performed in parallel, thereby achieving the lowering of power consumption of the SRAM 30 with suppressing access latency.

Each memory bank B0 to B7 has a power supply controller 31. The power supply controller 31 controls the power supply potential of the memory bank in response to the power-down signal φPDWN. The power supply controller 31 decreases the power supply potential VDD of the memory bank from the level V1 to the level V2 (<V1) when the power-down signal φPDWN becomes an active level (H level) and increases the power supply potential VDD of the memory bank from the level V2 to the level V1 when the power-down signal φPDWN becomes a non-active level (L level) (see FIG. 3).

The SRAM access arbiter 16 arbitrates access from a plurality of masters M1 to M3 to the multiple memory banks B0 to B7. The masters M1 to M3 are, for example, the main controller 11, host I/F 12, NAND controller 15 (see FIG. 1), and so on. The SRAM access arbiter 16 receives a clock φClock generated in a clock generator (not shown) inside or outside the controller 10 and arbitrates access from the plurality of masters M1 to M3 to the multiple memory banks B0 to B7 synchronously with the clock φClock.

For example, when needing to have the SRAM 30 hold sector data D0 to D15 from the master M1, the SRAM access arbiter 16 has the master sequentially access the memory bank B0 (D0), the memory bank B1 (D1), the memory bank B2 (D2), ..., the memory bank B7 (D7), the memory bank B0 (D8), ..., and the memory bank B7 (D15) in clock φClock periods on a per line basis.

Figure 4:
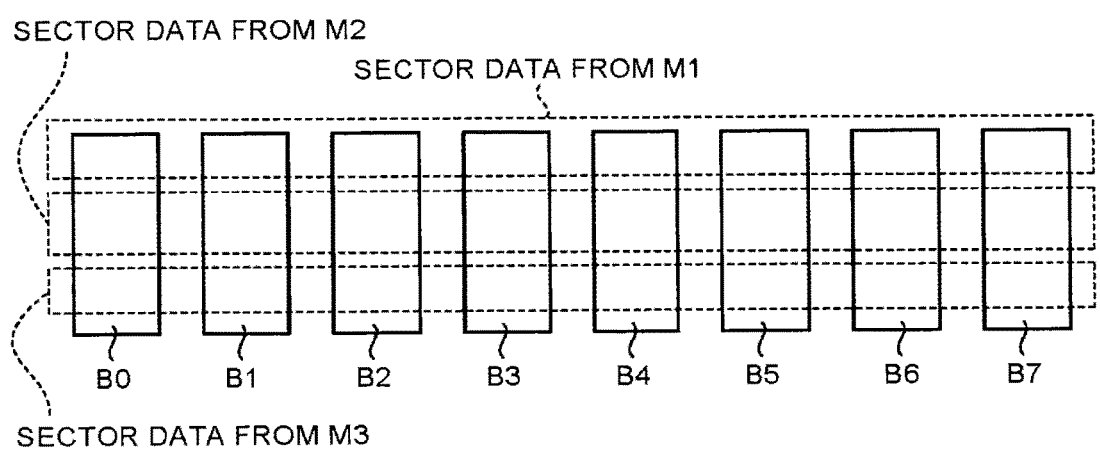
FIG. 4 is a diagram showing burst access to the SRAM in the embodiment.

That is, access to the SRAM 30 from the masters M1 to M3 is burst access as shown in FIG. 4 for the purpose of realizing higher operation speed than a required operation speed. The burst access is likely to realize high operation speed as compared with single access because address specification can be simplified.

For example, access to the SRAM 30 from the masters M2 to M3 always starts at the memory bank B0, and when reaching the memory bank B7 that is the last in the line, the next access takes place at the memory bank B0 again. That is, the masters M1 to M3 request access with incrementing the identifier of the memory bank B0 to B7 to access 1 by 1 in ascending order.

The power down controller 17 receives the clock φClock generated in the clock generator and performs control described later synchronously with the clock φClock.

Here, let us focus attention on each line in access to the SRAM 30 from the masters M1 to M3. For example, let us consider sequential one line access to the memory bank B0 (D0), the memory bank B1 (D1), the memory bank B2 (D2), the memory bank B3 (D3), . . . , and the memory bank B7 (D7) in clock φClock periods.

In this case, the time period Tdspd (see FIG. 3) in the aforementioned expression (1) is a period necessary to provide the power supply controllers 31 of the memory banks B0 to B7 with edges (e.g., rising edges) of the clock φClock to be used when the power supply controllers 31 of the memory banks B0 to B7 recognize a rising edge of the power-down signal φPDWN. That is, the time period Tdspd is a period for securing a timing margin from the timing when access to the memory banks B0 to B7 finishes to the timing when the power supply controllers 31 recognize a rising edge of the power-down signal φPDWN.

The time period Tpdce in the aforementioned expression (1) is a period necessary for the power supply voltage VDD controlled by the power supply controllers 31 of the memory banks B0 to B7 to rise from level V2 to level V1 so as to stabilize at level V1 (see FIG. 3). That is, the time period Tpdce is a period for securing a timing margin from the timing when the power supply controllers 31 starts to raise the level of the power supply voltage VDD to the timing when the level of the power supply voltage VDD stabilizes at level V1.

In the present embodiment, the leading one or more of the multiple memory banks B0 to B7 are first memory banks to be kept in the power-on state constantly, and the remaining memory banks are second memory banks which are brought between the power-on state and the power-down state. The number of memory banks which are kept in the power-on state constantly is a number corresponding to the time period Tpdce. With this configuration, in access to one line, access operation to the first memory banks and the wake-up operation of the second memory banks (operation for securing the time period Tpdce from releasing the memory bank from being in the power-down state until access operation to the memory bank becomes possible) are performed in parallel. Thus, while performing access operation to the first memory banks, the wake-up operation can be started at time period Tpdce earlier than the timing when to access the second memory bank, and hence when the timing when to access the second memory bank comes, access operation to the second memory bank can be started quickly.

For example, if the time period Tpdce corresponds to three periods of the clock φClock worth of time, the three leading memory banks B0 to B2 of the multiple memory banks B0 to B7 can be set to be first memory banks, and the remaining memory banks B3 to B7 can be set to be second memory banks.

The power down controller 17 performs the wake-up operation, which brings them from the power-down state to the power-on state, for the second memory banks in parallel with access operation to the first memory banks. That is, the power down controller 17 performs the wake-up operation of the second memory bank B3 in parallel with access operation to the first memory bank B0. The power down controller 17 performs the wake-up operation of the second memory bank B4 in parallel with access operation to the first memory bank B1. The power down controller 17 performs the wake-up operation of the second memory bank B5 in parallel with access operation to the first memory bank B2.

For example, during three periods of the clock φClock, sequential access operation to the multiple first memory banks B0, B1, B2 and the wake-up operation of the second memory bank B3 are performed in parallel. Thus, at the timing when sequential access operation to the multiple first memory banks B0 to B2 finishes, access operation to the second memory bank B3 to be accessed next can be started. That is, access operation to the multiple first memory banks B0 to B2 and the second memory bank B3 can be performed sequentially.

Further, the power down controller 17 performs the wake-up operation of ones of the multiple second memory banks for which wake-up operation has not finished in parallel with access operation to the first memory banks and access operation to ones of the multiple second memory banks for which wake-up operation has finished.

For example, during three periods of the clock φClock, sequential access operation to the multiple first memory banks B1, B2 and the second memory bank B3 and the wake-up operation of the second memory bank B4 are performed in parallel. Thus, at the timing when sequential access operation to the multiple first memory banks B1, B2 and the second memory bank B3 finishes, access operation to the second memory bank B4 to be accessed next can be started. That is, access operation to the multiple first memory banks B1, B2 and the multiple second memory banks B3, B4 can be performed sequentially.

During three periods of the clock φClock, sequential access operation to the first memory bank B2 and the multiple second memory banks B3, B4 and the wake-up operation of the second memory bank B5 are performed in parallel. Thus, at the timing when sequential access operation to the first memory bank B2 and the multiple second memory banks B3, B4 finishes, access operation to the second memory bank B5 to be accessed next can be started. That is, access operation to the first memory bank B2 and the multiple second memory banks B3, B4, B5 can be performed sequentially.

During three periods of the clock φClock, sequential access operation to the multiple second memory banks B3, B4, B5 and the wake-up operation of the second memory bank B6 are performed in parallel. Thus, at the timing when sequential access operation to the multiple second memory banks B3, B4, B5 finishes, access operation to the second memory bank B6 to be accessed next can be started. That is, access operation to the multiple second memory banks B3, B4, B5, B6 can be performed sequentially.

During three periods of the clock φClock, sequential access operation to the multiple second memory banks B4, B5, B6 and the wake-up operation of the second memory bank B7 are performed in parallel. Thus, at the timing when sequential access operation to the multiple second memory banks B4, B5, B6 finishes, access operation to the second memory bank B7 to be accessed next can be started. That is, access operation to the multiple second memory banks B4, B5, B6, B7 can be performed sequentially.

More specifically, the power down controller 17 receives requests for access to the first memory banks B0 to B2 and the second memory banks B3 to B7 from the SRAM access arbiter 16 and finds out timings when to access the first memory banks B0 to B2 and the second memory banks B3 to B7. Note that the requests for access to the first memory banks B0 to B2 and the second memory banks B3 to B7 are supplied also to the memory banks of interest from the SRAM access arbiter 16.

The power down controller 17 asserts the wake-up request signal φWakeupReq of the second memory bank B3 to B7 at the timing when to start the wake-up operation. Then the power down controller 17 deasserts the wake-up request signal φWakeupReq at the timing when a predetermined period (i.e., time period Tpdce shown in FIG. 3, e.g., three periods of the clock φClock) passes since having asserted the wake-up request signal φWakeupReq. Further, the power down controller 17 switches the power-on signal φPowerOn from L to H at the timing when the time period Tpdce passes since having asserted the wake-up request signal φWakeupReq and switches the power-down request signal φPowerDownReq from H to L at the timing when the time period Tdspd passes since having asserted the power-down request signal φPowerDownReq. That is, the power down controller 17 can produce the power-on signal φPowerOn from the wake-up request signal φWakeupReq and the power-down request signal φPowerDownReq.

The power down controller 17 has a power-down signal generator 171. The power-down signal generator 171 performs a NOR operation of the wake-up request signal φWakeupReq and the power-on signal φPowerOn to produce the power-down signal φPDWN. Thus, the power-down signal φPDWN can be produced from the wake-up request signal φWakeupReq and the power-down request signal φPowerDownReq. The power-down signal generator 171 supplies the produced power-down signal φPDWN to a corresponding one of the second memory banks B3 to B7.

That is, when either of the wake-up request signal φWakeupReq and the power-on signal φPowerOn is at an active level (H level), the power-down signal generator 171 sets the power-down signal φPDWN at a non-active level (L level). When both the wake-up request signal φWakeupReq and the power-on signal φPowerOn are at the non-active level (L level), the power-down signal generator 171 sets the power-down signal φPDWN at the active level (H level).

Figure 5:
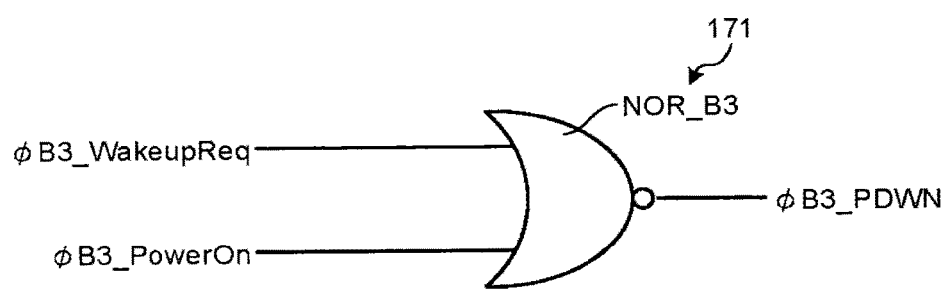
FIG. 5 is a diagram showing the configuration of a power-down signal generator in the embodiment.

The power-down signal generator 171 has, for example, a NOR gate NOR_B3 for the second memory bank B3 as shown in FIG. 5. FIG. 5 is a diagram showing the configuration of the power-down signal generator 171. The NOR gate NOR_B3 performs a NOR operation of the wake-up request signal B3_WakeupReq for the second memory bank B3 and the power-on signal φB3_PowerOn for the second memory bank B3 to produce the power-down signal φB3_PDWN for the second memory bank B3. The NOR gate NOR_B3 supplies the power-down signal B3_PDWN to the second memory bank B3.

It should be noted that the power-down signal generator 171 further has NOR gates NOR_B4 to NOR_B7 for the other second memory banks B4 to B7, which are not shown in the figures. The NOR gates NOR_B4 to NOR_B7 produce the power-down signals φB4_PDWN to φB7_PDWN to supply to the second memory banks B4 to B7 respectively.

Figure 6:
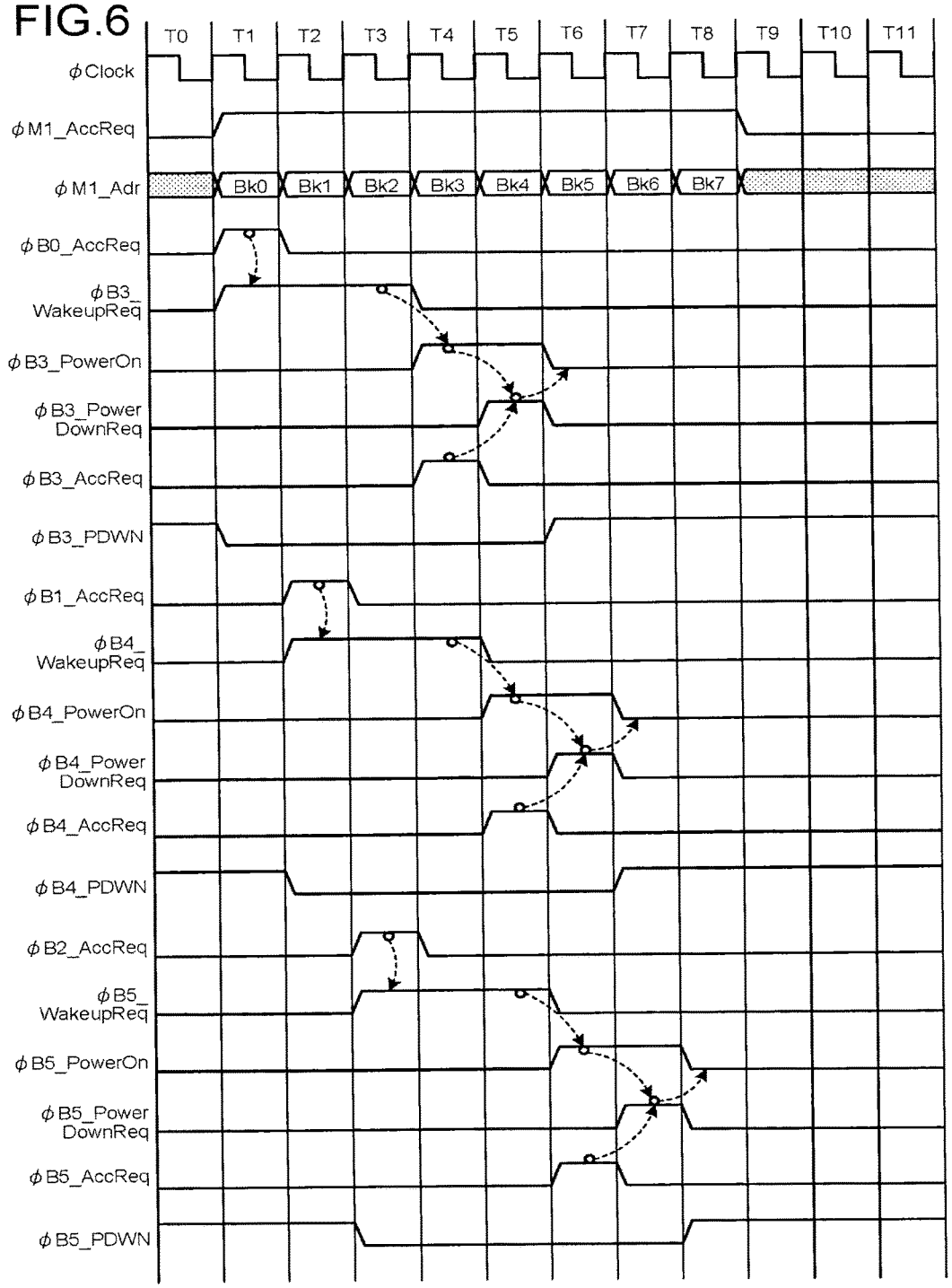
FIG. 6 is a waveform diagram (when a request for access to the SRAM from master M1 exists) showing the operation of the memory system according to the embodiment.
Figure 7:
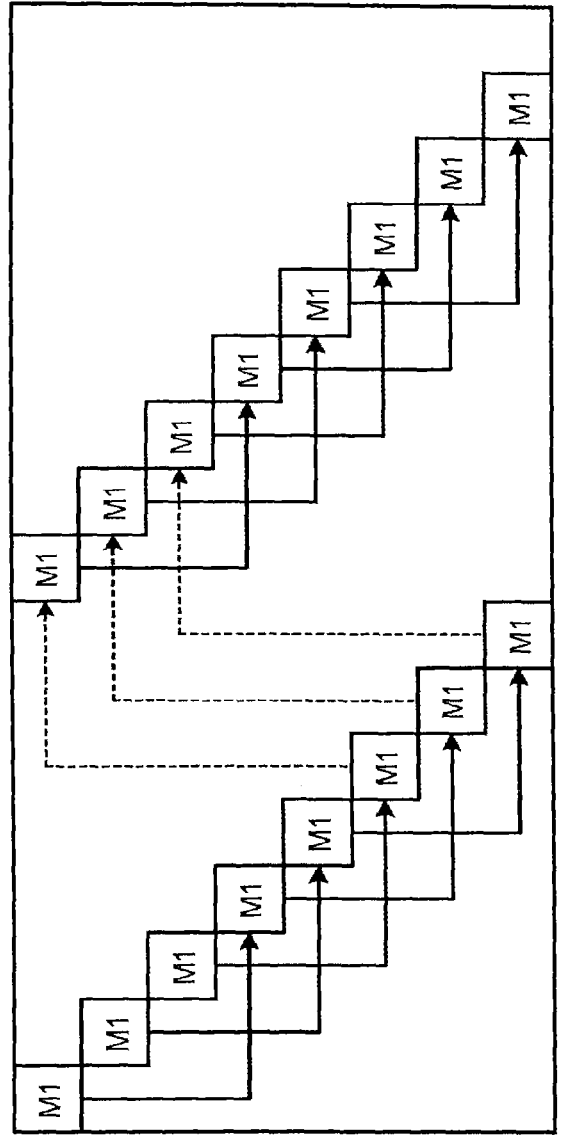
FIG. 7 is a sequence diagram (when a request for access to the SRAM from master M1 exists) showing the operation of the memory system according to the embodiment.

Next, the operation of the memory system 1 when one master M1 accesses the SRAM 30 will be described using FIGS. 6 and 7. FIG. 6 is a waveform diagram showing the operation of the memory system 1 in the case where one master M1 accesses the SRAM 30. FIG. 7 is a sequence diagram showing the operation of the memory system 1 in this case.

First, the meanings of the signals cited in FIG. 6 will be described.

In FIG. 6, the clock $Clock is a clock generated in the clock generator (not shown) and supplied to the SRAM access arbiter 16, the power down controller 17, and the power supply controllers 31 of the memory banks B0 to B7. An access request φM1_AccReq is a signal supplied from the master M1 to the SRAM access arbiter 16 and indicates an access request occurring when at the H level and an access request not occurring when at the L level. An address request φM1_Adr is a signal supplied from the master M1 to the SRAM access arbiter 16 and indicates to which memory bank a request for access occurs from master M1.

An access request signal φB0_AccReq is a signal supplied from the SRAM access arbiter 16 to the first memory bank B0 and to the power down controller 17 and indicates a request for access to the first memory bank B0 occurring. An access request signal φB1_AccReq is a signal supplied from the SRAM access arbiter 16 to the first memory bank B1 and to the power down controller 17 and indicates a request for access to the first memory bank B1 occurring. An access request signal φB2_AccReq is a signal supplied from the-SRAM access arbiter 16 to the first memory bank B2 and to the power down controller 17 and indicates a request for access to the first memory bank B2 occurring.

The wake-up request signal φB3_WakeupReq is a signal that the power down controller 17 generates in response to the assertion of the access request signal φB0_AccReq and is at the H level during the time when the wake-up operation for the second memory bank B3 is being performed. A wake-up request signal φB4_WakeupReq is a signal that the power down controller 17 generates in response to the assertion of the access request signal φB1_AccReq and is at the H level during the time when the wake-up operation for the second memory bank B4 is being performed. A wake-up request signal φB5 WakeupReq is a signal that the power down controller 17 generates in response to the assertion of the access request signal φB2_AccReq and is at the H level during the time when the wake-up operation for the second memory bank B5 is being performed. Note that the wake-up operation is operation for securing the time period Tpdce (see FIG. 3).

A power-down request signal φB3_PowerDownReq is a signal that the power down controller 17 generates in response to the deassertion of the access request signal φB2_AccReq and is at the H level during the time when the power-down operation for the second memory bank B3 (operation for securing the time period Tdspd from the time that access operation to the memory bank finishes to the time that it goes into the power-down state) is being performed. A power-down request signal φB4_PowerDownReq is a signal that the power down controller 17 generates in response to the deassertion of the access request signal φB4_AccReq and is at the H level during the time when the power-down operation for the second memory bank B4 is being performed. A power-down request signal φB5_PowerDownReq is a signal that the power down controller 17 generates in response to the deassertion of the access request signal φB5_AccReq and is at the H level during the time when the power-down operation for the second memory bank B5 is being performed.

Note that the power-down operation is operation for securing the time period Tdspd (see FIG. 3).

The power-on signal φB3_PowerOn is a signal that the power down controller 17 generates from the wake-up request signal φB3_WakeupReq and the power-down request signal φB3_PowerDownReq and is at the H level during the time when the second memory bank B3 is in the power-on state. A power-on signal φB4_PowerOn is a signal that the power down controller 17 generates from the wake-up request signal φB4_WakeupReq and the power-down request signal φB4_PowerDownReq and is at the H level during the time when the second memory bank B4 is in the power-on state. A power-on signal φB5_PowerOn is a signal that the power down controller 17 generates from the wake-up request signal φB5_WakeupReq and the power-down request signal φB5_PowerDownReq and is at the H level during the time when the second memory bank B5 is in the power-on state.

The power-down signal φB3_PDWN is a signal that the power down controller 17 generates from the wake-up request signal φB3_WakeupReq and the power-on signal φB3_PowerOn (see FIG. 5) to supply to the second memory bank B3. The power-down signal φB3_PDWN puts the second memory bank B3 in the power-down state when at the H level and releases the second memory bank B3 from being in the power-down state when at the L level. A power-down signal φB4_PDWN is a signal that the power down controller 17 generates from the wake-up request signal φB4_WakeupReq and the power-on signal φB4_PowerOn to supply to the second memory bank B4. The power-down signal φB4_PDWN puts the second memory bank B4 in the power-down state when at the H level and releases the second memory bank B4 from being in the power-down state when at the L level. A power-down signal φB5_PDWN is a signal that the power down controller 17 generates from the wake-up request signal φB5_WakeupReq and the power-on signal φB5_PowerOn to supply to the second memory bank B5. The power-down signal φB5_PDWN puts the second memory bank 55 in the power-down state when at the H level and releases the second memory bank B5 from being in the power-down state when at the L level.

Next, the meanings of the operations cited in FIG. 7 will be described.

In FIG. 7, periods T0 to T17 forming the horizontal axis correspond to periods T0 to T11 shown in FIG. 6.

The masters M1 to M3 forming part of the vertical axis correspond to the masters M1 to M3 shown in FIG. 2 and are provided to indicate from which master the access request occurs. For example, each square to the right of the master M1 indicates an access request in the period directly above the square, and the symbol B0 to B7 cited in each square indicates the memory bank B0 to B7 that is the access target of the access request. The case of FIG. 7 shows that, during periods T1 to TB, requests for access to the memory banks B0 to B7 sequentially occur and that, during periods T9 to T16, requests for access to the memory banks B0 to B7 sequentially occur again.

The memory banks B0 to B7 forming the other part of the vertical axis correspond to the memory banks B0 to B7 shown in FIG. 2 and are provided to indicate of which memory bank the operation (wake-up operation, access operation) is being performed. "Type" shown on the left of the memory banks B0 to B7 indicates the type of the corresponding memory bank B0 to B7. The memory banks B0 to B2 are of an AO (Always On) type that is kept in the power-on state, and the memory banks B3 to B7 are of a PD (Power Down) type that is brought between the power-on state and the power-down state.

Each square to the right of the memory banks B0 to B7 indicates access operation in the period directly above the square, and the symbol M1 cited in each square indicates the master M1 that is the access source of the access operation. The case of FIG. 7 shows that, during periods T1 to T8, access operation to the memory banks B0 to B7 are sequentially performed and that, during periods T9 to T16, access operation to the memory banks B0 to B7 are sequentially performed again.

The solid-line arrow that extends downward from each square indicating access operation and then from a lower position to the right, indicates wake-up operation in the periods shown directly above. For example, the solid-line arrow that extends downward from the bottom of the square indicating access operation to the memory bank B0 and then from a lower position to the right to the square indicating access operation to the memory bank B3, indicates wake-up operation of the memory bank B3 performed during the Periods T1 to T3.

The broken-line arrow that extends upward from each square indicating access operation and then from a higher position to the right, indicates wake-up operation not being performed for the memory banks B0 to B2 kept in the power-on state.

Next, the operation of the memory system 1 using the signals shown in FIG. 6 will be described.

In period T1 shown in FIG. 6, the SRAM access arbiter 16 receives the access request φM1_AccReq and address request φM1_Adr from the master M1. The SRAM access arbiter 16, in response to the access request φM1_AccReq and address request φM1_Adr (=Bk0), asserts the access request signal φB0_AccReq for the first memory bank B0 to supply to the first memory bank B0 and the power down controller 17. Thus, access operation from the master M1 to the first memory bank B0 is performed.

When realizing the occurrence of a request for access to the first memory bank B0 in response to the access request signal φB0_AccReq, the power down controller 17 asserts the wake-up request signal φB3_WakeupReq for the second memory bank B3. Accordingly the power down controller 17 deasserts the power-down signal φB3_PDWN for the second memory bank B3 to supply to the second memory bank B3. Thus, wake-up operation (operation for securing the time period Tpdce from releasing the memory bank from being in the power-down state until access operation to the memory bank becomes possible), which brings the power state from the power-down state to the power-on state, is started for the second memory bank B3, and the power supply potential VDD of the second memory bank B3 gradually rises from level V2 to level V1 (see FIG. 3).

In period T2, the SRAM access arbiter 16 receives the access request 011 AccReq and address request φM1_Adr from the master M1. The SRAM access arbiter 16, in response to the access request φM1_AccReq and address request φM1_Adr (=Bk1), asserts the access request signal φB1_AccReq for the first memory bank B1 to supply to the first memory bank B1 and the power down controller 17. Thus, access operation from the master M1 to the first memory bank B1 is performed.

When realizing the occurrence of a request for access to the first memory bank B1 in response to the access request signal φB1_AccReq, the power down controller 17 asserts the wake-up request signal φB4_WakeupReq for the second memory bank B4. Accordingly the power down controller 17 deasserts the power-down signal φB4_PDWN for the second memory bank B4 to supply to the second memory bank B4. Thus, wake-up operation (operation for securing the time period Tpdce from releasing the memory bank from being in the power-down state until access operation to the memory bank becomes possible), which brings the power state from the power-down state to the power-on state, is started for the second memory bank B4, and the power supply potential VDD of the second memory bank B4 gradually rises from level V2 to level V1 (see FIG. 3).

In period T3, the SRAM access arbiter 16 receives the access request φM1_AccReq and address request φM1_Adr from the master M1. The SRAM access arbiter 16, in response to the access request φM1_AccReq and address request φM1_Adr (=Bk2), asserts the access request signal φB2_AccReq for the first memory bank B2 to supply to the first memory bank B2 and the power down controller 17. Thus, access operation from the master M1 to the first memory bank B2 is performed.

When realizing the occurrence of a request for access to the first memory bank B2 in response to the access request signal φB2_AccReq, the power down controller 17 asserts the wake-up request signal φB5_WakeupReq for the second memory bank B5. Accordingly the power down controller 17 deasserts the power-down signal φB5_PDWN for the second memory bank B5 to supply to the second memory bank B5. Thus, wake-up operation (operation for securing the time period Tpdce from releasing the memory bank from being in the power-down state until access operation to the memory bank becomes possible), which brings the power state from the power-down state to the power-on state, is started for the second memory bank B5, and the power supply potential VDD of the second memory bank B5 gradually rises from level V2 to level V1 (see FIG. 3).

That is, as indicated by the solid-line arrows in FIG. 7, with access operation to the first memory banks B0 to B2 as a cue, wake-up operation (operation for securing the time period Tpdce until access to the SRAM becomes possible) occurs for the second memory banks B3 to B6 respectively. Note that notification of a power-on start to the first memory banks B0 to B2 after requests for access to the second memory banks B5 to B7, is not needed as indicated by the broken-line arrows in FIG. 7.

In period T4 shown in FIG. 6, the power down controller 17 deasserts the wake-up request signal φB3_WakeupReq for the second memory bank B3 and simultaneously asserts the power-on signal φB3_PowerOn for the second memory bank B3. During this period, the second memory bank B3 is in the power-on state, appearing to correspond to the power-on signal φB3_PowerOn. The SRAM access arbiter 16, in response to the access request φM1_AccReq and address request φM1_Adr (=Bk3), asserts the access request signal φB3_AccReq for the second memory bank B3 to supply to the second memory bank B3 and the power down controller 17. Thus, access operation to the second memory bank B3 becomes possible, and access operation from the master M1 to the second memory bank B3 is performed.

In period T5, when realizing that a request for access to the memory banks preceding by one to three banks (the first memory banks B0 to B2) is not occurring at the timing when access to the second memory bank B3 finishes (a timing in period T4) (see FIG. 7), the power down controller 17 asserts the power-down request signal φB3_PowerDownReq for the second memory bank B3. Thus, power-down operation, which brings the power state from the power-on state to the power-down state, is performed for the second memory bank B3.

Further, the power down controller 17 deasserts the wake-up request signal φB4_WakeupReq for the second memory bank B4 and simultaneously asserts the power-on signal φB4_PowerOn for the second memory bank B4. During this period, the second memory bank B4 is in the power-on state, appearing to correspond to the power-on signal φB4_PowerOn. The SRAM access arbiter 16, in response to the access request φM1_AccReq and address request φM1_Adr (=Bk4), asserts the access request signal φB4_AccReq for the second memory bank B4 to supply to the second memory bank B4 and the power down controller 17. Thus, access operation to the second memory bank B4 becomes possible, and access operation from the master M1 to the second memory bank B4 is performed.

In period T6, when realizing that a predetermined time period (i.e., time period Tdspd-shown in FIG. 3, e.g., one period of the clock φClock) has passed since the power-down request signal φB3_BowerDownReq started being asserted, the power down controller 17 deasserts the power-on signal φB3 PowerOn for the second memory bank B3. Accordingly the power down controller 17 asserts the power-down signal φB3_PDWN for the second memory bank B3 to supply to the second memory bank B3. Thus, the second memory bank B3 is brought to the power-down state, and the power supply potential VDD of the second memory bank B3 falls from level V1 to level V2 (see FIG. 3).

Further, when realizing that a request for access to the memory banks preceding by one to three banks (the first memory banks B1, B2, and second memory bank B3) is not occurring at the timing when access to the second memory bank B4 finishes (a timing in period T5) (see FIG. 7), the power down controller 17 asserts the power-down request signal φB4_PowerDownReq for the second memory bank B4. Thus, power-down operation, which brings the power state from the power-on state to the power-down state, is performed for the second memory bank B4.

Further, the power down controller 17 deasserts the wake-up request signal φB5_WakeupReq for the second memory bank B5 and simultaneously asserts the power-on signal φB5_PowerOn for the second memory bank B5. During this period, the second memory bank B5 is in the power-on state, appearing to correspond to the power-on signal φB5_PowerOn. The SRAM access arbiter 16, in response to the access request φM1_AccReq and address request φM1_Adr (=Bk5), asserts the access request signal φB5_AccReq for the second memory bank B5 to supply to the second memory bank B5 and the power down controller 17. Thus, access operation to the second memory bank B5 becomes possible, and access operation from the master M1 to the second memory bank B5 is performed.

In period T7, when realizing that a predetermined time period (i.e, time period Tdspd shown in FIG. 3, e.g., one period of the clock φClock) has passed since the power-down request signal φB4_PowerDownReq started being asserted, the power down controller 17 deasserts the power-on signal φB4_PowerOn for the second memory bank B4. Accordingly the power down controller 17 asserts the power-down signal φB4_PDWN for the second memory bank B4 to supply to the second memory bank B4. Thus, the second memory bank B4 is brought to the power-down state, and the power supply potential VDD of the second memory bank B4 falls from level V1 to level V2 (see FIG. 3).

Further, when realizing that a request for access to the memory banks preceding by one to three banks (the first memory bank B2, and second memory banks B3, B4) is not occurring at the timing when access to the second memory bank B5 finishes (a timing in period T6) (see FIG. 7), the power down controller 17 asserts the power-down request signal φB5_PowerDownReq for the second memory bank B5. Thus, power-down operation, which brings the power state from the power-on state to the power-down state, is performed for the second memory bank B5.

In period T8, when realizing that a predetermined time period (i.e., time period Tdspd shown in FIG. 3, e.g., one period of the clock φClock) has passed since the power-down request signal φB5_PowerDownReq started being asserted, the power down controller 17 deasserts the power-on signal φB5_PowerOn for the second memory bank B5. Accordingly the power down controller 17 asserts the power-down signal φB5_PDWN for the second memory bank B5 to supply to the second memory bank B5. Thus, the second memory bank B5 is brought to the power-down state, and the power supply potential VDD of the second memory bank B5 falls from level V1 to level V2 (see FIG. 3).

In this way, wake-up operation, access operation, and power-down operation are sequentially performed for each of the multiple second memory banks B3 to B7, in parallel between the multiple second memory banks B3 to B7 as indicated by the solid-line arrows and squares in FIG. 7. Thus, the period during which each of the second memory banks B3 to B7 is kept in the power-on state can be easily shortened, and each of the second memory banks B3 to B7 can be powered on for an appropriate length of time (e.g., minimum necessary cycles).

Figure 8:
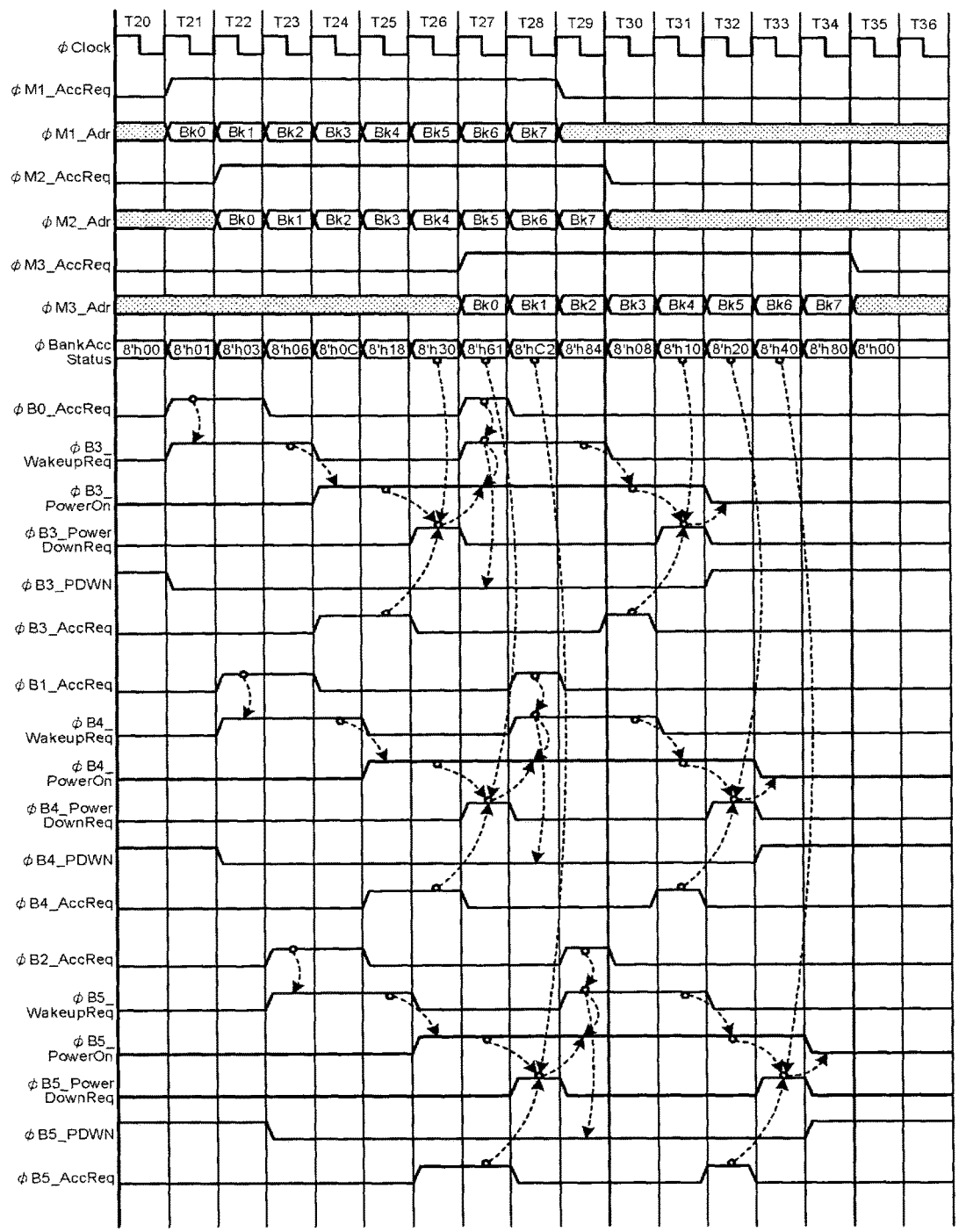
FIG. 8 is a waveform diagram (when requests for access to the SRAM from masters M1, M2, and M3 at different timings exist) showing the operation of the memory system according to the embodiment.
Figure 9:
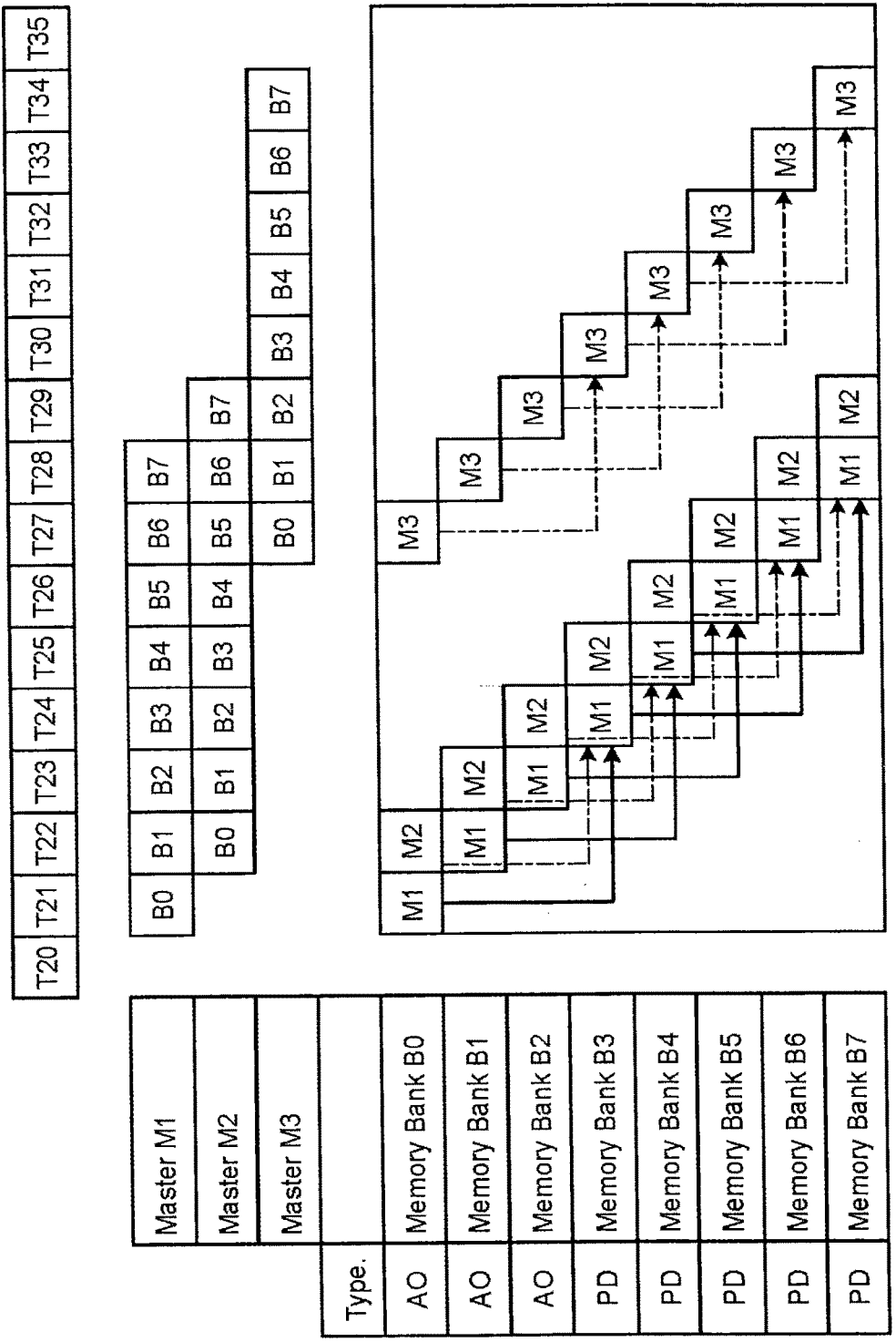
FIG. 9 is a sequence diagram (when requests for access to the SRAM from masters M1, M2, and M3 at different timings exist) showing the operation of the memory system according to the embodiment.

Next, the operation of the memory system 1 where three masters M1 to M3 request access to the SRAM 30 at different timings will be described using FIGS. 8 and 9. FIG. 8 is a waveform diagram showing the operation of the memory system 1 in this case. FIG. 9 is a sequence diagram showing the operation of the memory system 1 in this case. In FIG. 9, wake-up operation and power-down operation of the master M1 are indicated by solid-line arrows; wake-up operation and power-down operation of the master M2 are indicated by chain-line arrows; and wake-up operation and power-down operation of the master M3 are indicated by two-dot chain-line arrows.

As a case where three masters M1 to M3 request access to the SRAM 30 at different timings, the case where access requests from the masters M1 to M3 occur in periods T21, T22, T27 respectively as shown in FIGS. 8 and 9 will be described. For example, the host I/F 12 receives a write command and data transmitted from the host 100, and according to it, the main controller 11 creates a write request and write data, which means that a path via which to write the write data into the SRAM 30 exists. The main controller 11 that issues the write request is designated as the master M1. Next, a path via which the main controller 11 reads data from the SRAM 30 exists in order to add an error correcting code to the write data for the SRAM 30, and the main controller 11 that issues the read request is designated as the master M2. Finally, a read path for writing the write data in the SRAM 30 into the NAND-type flash memory 40 exists, and the NAND controller 15 that issues the read request is designated as the master M3.

Focusing attention on access from the master M1, operation that is basically similar to in periods T1 to T7 shown in FIGS. 6 and 7 but different in the points below is performed in periods T21 to T28 shown in FIGS. 8 and 9. Focusing attention on access from the master M2, operation that is basically similar to in periods T1 to T7 shown in FIGS. 6 and 7 but different in the points below is performed in periods T22 to T29 shown in FIGS. 8 and 9. Focusing attention on access from the master M3, operation that is basically similar to in periods T1 to T7 shown in FIGS. 6 and 7 but different in the points below is performed in periods T27 to T34 shown in FIGS. 8 and 9.

In periods T21 to T34 shown 8 and 9, because of being requested to perform access operation from the plurality of masters M1 to M3, the SRAM access arbiter 16 arbitrates access to the multiple first memory banks B0 to 82 and the multiple second memory banks B3 to B7 from the plurality of masters M1 to M3. Then, the SRAM access arbiter 16 generates an access status signal φBankAccStatus as the arbitrating result to supply to the power down controller 17. The access status signal φBankAccStatus is a flag signal indicating the arbitrating result of the SRAM access arbiter 16, wherein bits corresponding to memory banks to which requests for access are being made are asserted. Note that the power-down control of the memory banks B0 to B7 can be performed without finding out from which master the access request is, as long as to which memory bank a request for access is occurring is realized.

For example, in period T22, the access status signal φMasterAccStatus=8'h03=8'b0000_0011. In the bit string "0000_0011" obtained by expanding "03" in hexadecimal format (h) to binary format (b), the bits in the order of from the least significant bit indicate by value whether a request for access to the memory banks B0 to B7 is occurring. Because in this bit string, the zeroth bit (least significant bit) and the first bit (second least significant bit) assert "1", the power down controller 17 finds out that the SRAM access arbiter 16 is making requests for access to the first memory bank B0 and the first memory bank B1 occur.

That is, the SRAM access arbiter 16 keeps the access request signal φB0_AccReq for the first memory bank B0 in an asserted state to supply to the first memory bank B0 and the power down controller 17. Thus, access operation from the master M2 to the first memory bank B0 is performed. The power down controller 17 keeps the wake-up request signal φB3_WakeupReq for the second memory bank B3 in the asserted state according to the access request signal φB0_AccReq. Further, the power down controller 17 keeps the power-down signal φB3_PDWN for the second memory bank B3 in a deasserted state to supply to the second memory bank B3. Thus, the second memory bank B3 continues wake-up operation (operation for securing the time period Tpdce from releasing the memory bank from being in the power-down state until access operation to the memory bank becomes possible), and the power supply potential VDD thereof is kept at level V1 (see FIG. 3).

At the same time, the SRAM access arbiter 16 asserts the access request signal φB1_AccReq for the first memory bank B1 to supply to the first memory bank B1 and the power down controller 17. Thus, access operation from the master M1 to the first memory bank B1 is performed. The power down controller 17 asserts the wake-up request signal φB4_WakeupReq for the second memory bank B4 according to the access request signal φB1_AccReq. Further, the power down controller 17 deasserts the power-down signal φB4_PDWN for the second memory bank B4 to supply to the second memory bank B4. With this performance, for the second memory bank B4, wake-up operation (operation for securing the time period Tpdce from releasing the memory bank from being in the power-down state until access operation to the memory bank becomes possible), which brings the power state from the power-down state to the power-on state, is started, and the power supply potential VDD of the second memory bank B4 rises from level V2 to level V1 (see FIG. 3).

In period T26, the access status signal φBankAccStatus=8'h30=8'b0011_0000. In the bit string "0011_0000" obtained by expanding "30" in hexadecimal format (h) to binary format (b), the bits in the order of from the least significant bit indicate by value whether a request for access to the memory banks B0 to B7 is occurring. Because in this bit string the fourth bit (higher by 4 bits than the least significant) and the fifth bit (higher by 5 bits than the least significant) assert "1", the power down controller 17 finds out that the SRAM access arbiter 16 is making requests for access to the second memory bank B4 and the second memory bank B5 occur.

That is, the SRAM access arbiter 16 keeps the access request signal φB4_AccReq for the second memory bank B4 in the asserted state to supply to the second memory bank B4 and the power down controller 17. Thus, access operation from the master M2 to the second memory bank B4 is performed.

At the same time, the SRAM access arbiter 16 asserts the access request signal φB5_AccReq for the second memory bank B5 to supply to the second memory bank B5 and the power down controller 17. Thus, access operation from the master M1 to the second memory bank B5 is performed.

Further, because in the bit string "0011_0000" the third bit (higher by 3 bits than the least significant) deasserts "0", the power down controller 17 finds out that the SRAM access arbiter 16 has ended the request for access to the second memory bank B3. From the access status signal φBankAccStatus=8'h30 and the access request signal φB3_AccReq having changed from H to L, the power down controller 17 realizes that access operation to the memory bank B3 has finished and in response to that, asserts the power-down request signal φB3_PowerDownReq for the second memory bank B3.

In period T27, the access status signal φBankAccStatus=8'h61=8'b0110_0001. In the bit string "0110_0001" obtained by expanding "61" in hexadecimal format (h) to binary format (b), the bits in the order of from the least significant bit indicate by value whether a request for access to the memory banks B0 to B7 is occurring. Because in this bit string the zeroth bit (least significant bit), the fifth bit (higher by 5 bits than the least significant), and the sixth bit (higher by 6 bits than the least significant) assert "1", it is found out that the SRAM access arbiter 16 is making requests for access to the first memory bank B0, the second memory bank B5, and the second memory bank B6 occur.

That is, the SRAM access arbiter 16 asserts the access request signal φB0_AccReq for the first memory bank B0 to supply to the first memory bank B0 and the power down controller 17. The SRAM access arbiter 16 asserts the access request signal φB5_AccReq for the second memory bank B5 to supply to the second memory bank B5 and the power down controller 17. The SRAM access arbiter 16 asserts the access request signal φB6_AccReq (not shown) for the second memory bank B6 to supply to the second memory bank B6 and the power down controller 17.

When realizing that a predetermined time period (i.e., time period Tdspd shown in FIG. 3, e.g., one period of the clock φClock) has passed since the power-down request signal φB3_PowerDownReq started being asserted but that a request for access to the first memory bank B0 of the memory banks preceding by one to three banks (the first memory banks B0 to B2) is occurring, the power down controller 17 drops a request for bringing the power state to the power-off state for the second memory bank B3. That is, the power down controller 17 keeps the power-on signal φB3_PowerOn for the second memory bank B3 in the asserted state in response to the occurrence of a request for access to the first memory bank B0. Accordingly the power down controller 17 keeps the power-down signal φB3_PDWN for the second memory bank B3 in the deasserted state to supply to the second memory bank B3. Thus, the second memory bank B3 keeps in the power-on state, and the power supply potential VDD thereof is kept at level V1 (see FIG. 3).

In this way, the wake-up operation of the second memory banks B3 to B7 for access from the master M1 indicated by solid-line arrows in FIG. 9 and wake-up operation of the second memory banks B3 to B7 for access from the master M2 indicated by chain-line arrows in FIG. 9 are performed in parallel between the second memory banks B3 to B7, in common for each of the second memory banks B3 to B7. Further, considering access from the master M3, the power-down operation of the second memory banks B3 to B7 are not performed during periods T26 to T30, but are sequentially performed during periods T31 to T35 for the second memory banks B3 to B7. Thus, with access to the multiple first memory banks B0 to B2 and the multiple second memory banks B3 to B7 from the masters M1 to M3 being performed in parallel, the period during which each of the second memory banks B3 to B7 is kept in the power-on state can be easily shortened, and each of the second memory banks B3 to B7 can be powered on for an appropriate length of time (e.g., minimum necessary cycles).

Figure 10:
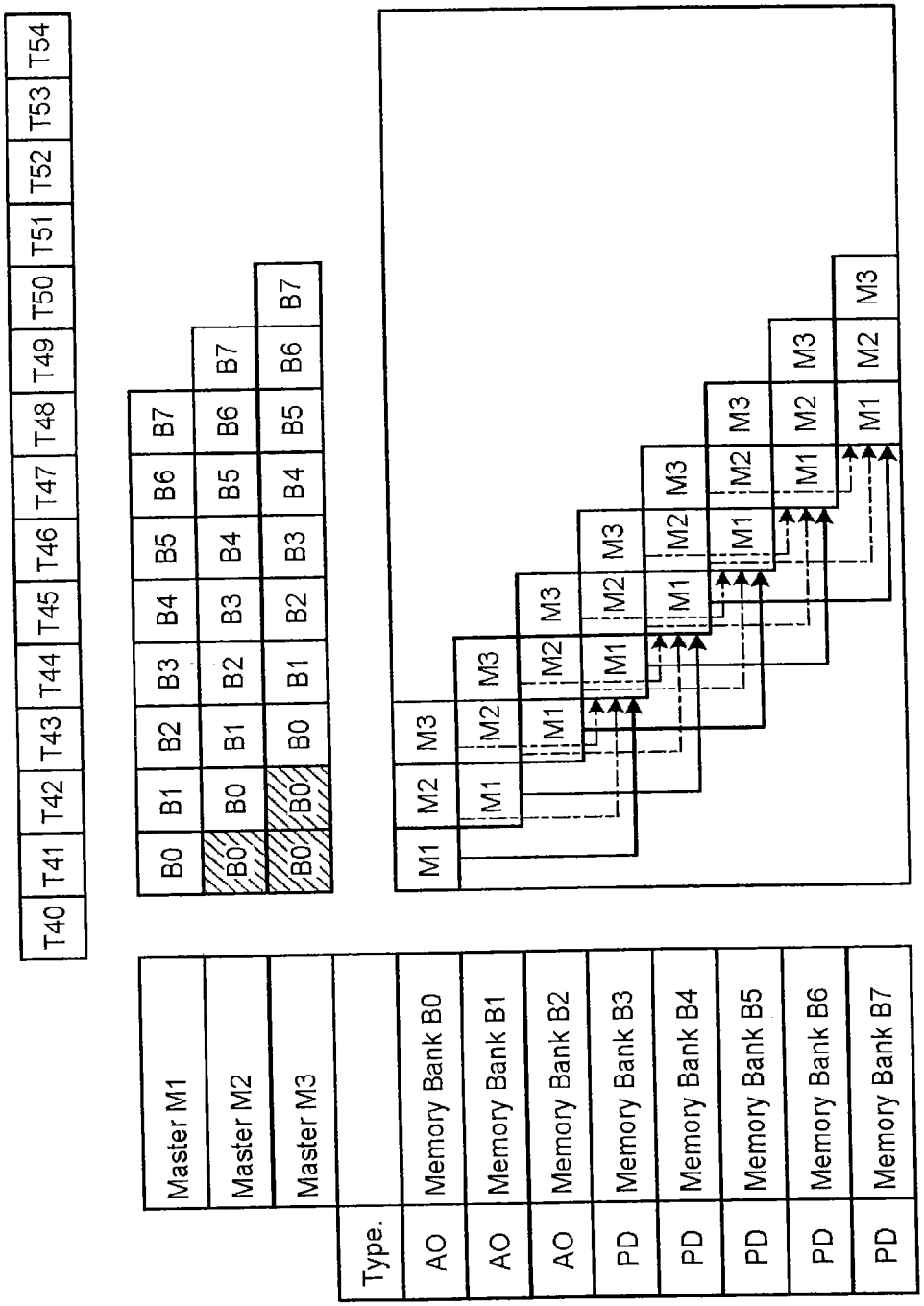
FIG. 10 is a sequence diagram (when requests for access to the SRAM from masters M1, M2, and M3 at the same timing exist) showing the operation of the memory system according to the embodiment.

Next, the operation of the memory system 1 when the three masters M1 to M3 request access to the SRAM 30 at the same timing will be described using FIG. 10. FIG. 10 is a sequence diagram showing the operation of the memory system 1 in this case.

As a case where the three masters M1 to M3 request access to the SRAM 30 at the same timing, the case where access requests from the masters M1, M2, M3 all occur in period T41 as shown in FIG. 10 will be described. The SRAM access arbiter 16 decides on masters of higher priority and masters of lower priority among the plurality of masters M1, M2, M3 that are issuing an access request at the same time. The SRAM access arbiter 16 decides on priorities for the masters M1, M2, M3 that are issuing an access request at the same time according to, e.g., the round robin method. The SRAM access arbiter 16 makes access operation from the masters M1, M2, M3 start sequentially according to the decided-on priorities.

For example, if it is decided that the priority of the master M1>the priority of the master M2>the priority of the master M3, then the SRAM access arbiter 16 makes, of requests for access to the first memory bank B0 from the masters M1, M2, M3 that all occurred in period T41, the request for access to the first memory bank B0 from the master M2 occur also in subsequent period T42 and the request for access to the first memory bank B0 from the master M3 occur also in subsequent periods T42, T43. At the same time, the SRAM access arbiter 16, ignoring access requests indicated by oblique lines in FIG. 10, supplies an access request to the memory bank designated in the access request. Thus, the SRAM access arbiter 16 makes access operation from the master M1 start during period T41, access operation from the master M2 start during period T42, and access operation from the master M3 start during period T43.

That is, access operation to the first memory bank B0 from the master M1 is performed during period T41. Access operation to the first memory bank B0 from the master M2 is made to wait during period T41 and performed during period T42. Access operation to the first memory bank B0 from the master M3 is made to wait during periods T41, T42 and performed during period T43.

At this time, the wake-up operation of the second memory banks B3 to B7 for access from the master M1 indicated by solid-line arrows in FIG. 10, the wake-up operation of the second memory banks B3 to B7 for access from the master M2 indicated by chain-line arrows in FIG. 10, and the wake-up operation of the second memory banks B3 to B7 for access from the master M3 indicated by two-dot chain-line arrows in FIG. 10 are performed in parallel between the plurality of second memory banks B3 to B7, in common for each of the second memory banks B3 to B7. Also, the power-down operation of the second memory banks B3 to B7 are sequentially performed during periods T47 to T51. Thus, with access operation to the multiple first memory banks B0 to B2 and the multiple second memory banks B3 to B7 from the masters M1 to M3 being performed in parallel, the period during which each of the second memory banks B3 to B7 is kept in the power-on state can be easily shortened, and each of the second memory banks B3 to B7 can be powered on for an appropriate length of time (e.g., minimum necessary cycles).

As described above, in the present embodiment, in the memory system 1, the power down controller 17 performs the wake-up operation of the second memory banks B3 to B7 in parallel with access operation to the first memory banks B0 to B2. Thus, while performing access operation to the first memory banks, the wake-up operation can be started at time period Tpdce earlier than the timing when to access the second memory bank, and thus when the timing when to access the second memory bank comes, access operation to the second memory bank can be started quickly. After access operation to the second memory bank is performed, the power down controller 17 performs the power-down operation of the second memory bank. As a result, the lowering of power consumption of the SRAM 30 can be achieved without reducing latency of access to the SRAM 30 including the multiple first memory banks B0 to B2 and the multiple second memory banks B3 to B7.

Further, in the present embodiment, in the memory system 1, the power down controller 17 performs the wake-up operation of the second memory bank B3-in parallel with access operation in which the first memory banks B0 to B2 are sequentially accessed. The power down controller 17 puts the second memory bank B3 in an access-operation enabled state after the wake-up operation of the second memory bank B3 is performed. Thus, access operation to the first memory banks B0 to B2 and the second memory bank B3 can be performed sequentially and seamlessly.

Yet further, in the present embodiment, in the memory system 1, the power down controller 17 performs the wake-up operation of the second memory bank B4, for which wake-up operation has not finished, in parallel with access operation to the first memory banks B0 to B2 and the second memory bank B3, for which wake-up operation has finished. Thus, access operation to the first memory banks B0 to B2 and the second memory banks B3, B4 can be performed sequentially and seamlessly.

Still further, in the present embodiment, in the memory system 1, the power down controller 17 performs the wake-up operation of the second memory banks B3 to B7, access operation to the second memory banks B3 to B7, and the power-down operation of the second memory banks B3 to B7 in parallel between the second memory banks B3 to B7, sequentially for each of the second memory banks B3 to B7. Thus, the period during which each of the second memory banks B3 to B7 is kept in the power-on state can be easily shortened, and each of the second memory banks B3 to B7 can be powered on for an appropriate length of time (e.g., minimum necessary cycles). That is, the power consumption of the SRAM 30 can be reduced efficiently.

Further, in the present embodiment, in the memory system 1, the power down controller 17, according to the arbitrating result of the SRAM access arbiter 16, performs the wake-up operation of the second memory banks B3 to B7 that is performed in parallel with sequential access operation to the multiple first memory banks B0 to B2 and the multiple second memory banks B3 to B4 from the master M1 and the wake-up operation of the second memory banks B3 to B7 that is performed in parallel with sequential access operation to the multiple first memory banks B0 to B2 and the multiple second memory banks B3 to B4 from the master M2, in parallel between the second memory banks B3 to B7, in common for each of the second memory banks B3 to B7. The power-down operation of the second memory banks B3 to B7 are performed sequentially. Thus, with access to the multiple first memory banks B0 to B2 and the multiple second memory banks B3 to B7 from the masters M1 to M3 being performed in parallel, the period during which each of the second memory banks B3 to B7 is kept in the power-on state, can be easily shortened, and each of the second memory banks B3 to B7 can be powered on for an appropriate length of time (e.g., minimum necessary cycles).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a volatile memory having $1^{st}$ to $K^{th}$ memory banks, where K is a natural number equal to or larger than 2, that are kept in a power-on state, and $(K+1)^{th}$ to $N^{th}$ memory banks, where N is a natural number larger than K, whose power state is changed, the power state being the power-on state or a power-down state;
    a controller that performs a wake-up operation for the $(K+1)^{th}$ to $N^{th}$ memory banks in parallel with an access operation to the $1^{st}$ to $K^{th}$ memory banks, the wake-up operation changing the power state from the power-down state to the power-on state, the controller also performing a power-down operation for a certain memory bank among the $(K+1)^{th}$ to $N^{th}$ memory banks after the access operation to the certain memory bank is performed, the power-down operation changing the power state from the power-on state to the power-down state; and
    a master that sends an access request to the $1^{st}$ to $N^{th}$ memory banks in a sequential order.

2. The memory system according to claim 1, wherein the controller performs sequentially the wake-up operation of the $(K+1)^{th}$ to $N^{th}$ memory banks in parallel with the access operation in which the $1^{st}$ to $K^{th}$ memory banks are sequentially accessed.

3. The memory system according to claim 2, wherein the controller performs a wake-up operation of the $(I+K)^{th}$ memory bank $(0 \le I < (N-K))$ in parallel with an access operation to the $I^{th}$ memory bank.

4. The memory system according to claim 3, wherein a value of the K is decided based on a time that is required for the access operation to a memory bank among the $1^{st}$ to $K^{th}$ memory banks and on a time that is required for the wake-up operation in a memory bank among the $(K+1)^{th}$ to $N^{th}$ memory banks.

5. The memory system according to claim 1, further comprising one or more additional masters, each of the master and the one or more additional masters sending an access request to the $1^{st}$ to $N^{th}$ memory banks in a sequential order.

6. The memory system according to claim 5, further comprising an arbiter that arbitrates accesses to the $1^{st}$ to $N^{th}$ memory banks from the master and the one or more additional masters, wherein
    the arbiter has an information indicating a memory bank for which the access operation is performed among the $1^{st}$ to $N^{th}$ memory banks, and
    the controller, based on the information, decides to perform or not to perform the power-down operation for a memory bank among the $(K+1)^{th}$ to $N^{th}$ memory banks after the access operation to the memory bank.

7. The memory system according to claim 6, wherein a value of the K is decided based on a time that is required for the access operation to a memory bank among the $1^{st}$ to $K^{th}$ memory banks and on a time that is required for the wake-up operation in a memory bank among the $(K+1)^{th}$ to $N^{th}$ memory banks.

8. The memory system according to claim 1, wherein the volatile memory includes Static Random Access Memory (SRAM).

9. A method of controlling a memory system that includes a volatile memory, the volatile memory having $1^{st}$ to $K^{th}$ memory banks, where K is a natural number equal to or larger than 2, that are kept in a power-on state and $(K+1)^{th}$ to $N^{th}$ memory banks, where N is a natural number larger than K, whose power state is changed, the power state being the power-on state or a power-down state, the method comprising:
    performing an access operation to the $1^{st}$ to $K^{th}$ memory banks;
    performing a wake-up operation for the $(K+1)^{th}$ to $N^{th}$ memory banks, the wake-up operation changing the power state from the power-down state to the power-on state, wherein the access operation and the wake-up operation are performed in parallel; and
    performing a power-down operation for a certain memory bank among the $(K+1)^{th}$ to $N^{th}$ memory banks after the access operation to the certain memory bank is performed, the power-down operation changing the power state from the power-on state to the power-down state; and
    sending an access request from a master to the $1^{st}$ to $N^{th}$ memory banks in a sequential order.

10. The method according to claim 9, wherein the performing the wake-up operation includes performing sequentially a wake-up operation of the $(K+1)^{th}$ to $N^{th}$ memory banks in parallel with the access operation in which the $1^{st}$ to $K^{th}$ memory banks are sequentially accessed.

11. The method according to claim 10, wherein the performing sequentially the wake-up operation includes performing a wake-up operation of the $(I+K)^{th}$ memory bank $(0 \leq I < (N-K))$ in parallel with an access operation to the $I^{th}$ memory bank.

12. The method according to claim 11, wherein a value of the K is decided based on a time that is required for the access operation to a memory bank among the $1^{st}$ to $K^{th}$ memory banks and on a time that is required for the wake-up operation in a memory bank among the $(K+1)^{th}$ to $N^{th}$ memory banks.

13. The method according to claim 9, further comprising sending an access request from each of the master and one or more additional masters to the $1^{st}$ to $N^{th}$ memory banks in a sequential order.

14. The method according to claim 13, further comprising:
   arbitrating accesses to the $1^{st}$ to $N^{th}$ memory banks from the master and the one or more additional masters; and
   deciding, based on information indicating a memory bank for which the access operation is performed among the $1^{st}$ to $N^{th}$ memory banks, to perform or not to perform the power-down operation for a certain memory bank among the $(K+1)^{th}$ to $N^{th}$ memory banks after the access operation to the certain memory bank.

15. The method according to claim 14 wherein a value of the K is decided based on a time that is required for the access operation to a memory bank among the $1^{st}$ to $K^{th}$ memory banks and on a time that is required for the wake-up operation in a memory bank among the $(K+1)^{th}$ to $N^{th}$ memory banks.

16. The memory system according to claim 9, wherein the volatile memory includes Static Random Access Memory (SRAM).

17. A memory system, comprising:
   a plurality of memory regions, a number of memory regions being N, where N is a natural number larger than 2, having $1^{st}$ to $K^{th}$ memory regions, where K is a natural number equal to or larger than 2 and smaller than N, that are kept in a power-on state and $(K+1)^{th}$ to $N^{th}$ memory regions whose power state is changed, the power state being the power-on state or a power-down state;
   a controller that is configured to access, in parallel, two memory regions among the plurality of memory regions, the controller performing a wake-up operation for the $(K+1)^{th}$ to $N^{th}$ memory regions in parallel with an access operation to the $1^{st}$ to $K^{th}$ memory regions, the wake-up operation changing the power state from the power-down state to the power-on state, the controller performing a power-down operation for a certain memory region among the $(K+1)^{th}$ to $N^{th}$ memory regions after the access operation to the certain memory region is performed, the power-down operation changing the power state from the power-on state to the power-down state; and
   a master that sends an access request to the $1^{st}$ to $N^{th}$ memory regions in a sequential order.

18. The memory system according to claim 17, wherein the controller performs sequentially the wake-up operation of the $(K+1)^{th}$ to $N^{th}$ memory regions in parallel with the access operation in which the $1^{st}$ to $K^{th}$ memory regions are sequentially accessed.

19. The memory system according to claim 18, wherein the controller performs a wake-up operation of the $(I+K)^{th}$ memory region $(0 \leq I < (N-K))$ in parallel with an access operation to the $I^{th}$ memory region.

20. The memory system according to claim 19, wherein a value of the K is decided based on a time that is required for the access operation to a memory region among the $1^{st}$ to $K^{th}$ memory regions and on a time that is required for the wake-up operation in a memory region among the $(K+1)^{th}$ to $N^{th}$ memory regions.

\* \* \* \* \*